(12) United States Patent
Huang et al.

(10) Patent No.: US 7,009,436 B2
(45) Date of Patent: Mar. 7, 2006

(54) PULSEWIDTH CONTROL LOOP DEVICE WITH COMPLEMENTARY SIGNALS

(75) Inventors: Hong-Yi Huang, Taipei (TW); Wei-Ming Lin, Taipei (TW)

(73) Assignee: Pericom Technology (Shanghai) Co., Ltd., Shanghai (CN)

(*) Notice: Subject to any disclaimer, the term of this patent is extended or adjusted under 35 U.S.C. 154(b) by 105 days.

(21) Appl. No.: 10/820,766

(22) Filed: Apr. 9, 2004

(65) Prior Publication Data
US 2005/0225369 A1    Oct. 13, 2005

(51) Int. Cl.
*H03K 3/17* (2006.01)
(52) U.S. Cl. ............... 327/172; 327/175; 327/298
(58) Field of Classification Search ............... None
See application file for complete search history.

(56) References Cited

U.S. PATENT DOCUMENTS 5,121,085 A * 6/1992 Brown .................... 331/8
5,502,419 A * 3/1996 Kawasaki et al. ......... 332/109
5,610,954 A * 3/1997 Miyashita et al. ......... 375/375
5,740,213 A * 4/1998 Dreyer .................... 375/374

* cited by examiner

Primary Examiner—Timothy P. Callahan
Assistant Examiner—An T. Luu
(74) Attorney, Agent, or Firm—Rosenberg, Klein & Lee

(57) ABSTRACT

The present invention provides one pulsewidth control loop (PWCL) device with complementary signals. The PWCL device includes one control stage circuit, one buffer chain, one complementary circuit, two charge pumps, and one comparator. The control stage circuit is used to receive a clock signal and the control signal of the comparator, and output a signal to the buffer chain. The buffer chain is used to receive the output signal from the control stage circuit and output a signal to the complementary circuit. The complementary circuit is used to receive the output signal from the buffer chain and output two complementary signals. Each of the two charge pumps is used to receive one of the output signals from the complementary circuit and output a signal to be one of the inputs of the comparator. The comparator is used to receive the output signals from each of the two charge pumps. Then, the comparator outputs a signal and feedbacks to be one of the input signals of the control stage circuit. The control loop device utilizes the complementary signals to adjust the pulsewidth and increase the stability of the control loop device.

18 Claims, 6 Drawing Sheets

PULSEWIDTH CONTROL LOOP DEVICE WITH COMPLEMENTARY SIGNALS

BACKGROUND OF THE INVENTION

1. Field of the Invention

The present invention relates generally to a pulsewidth control loop (PWCL) device with complementary signals, and more particularly, to a PWCL with operation stability-increasing, process variation-reducing and power dissipation-saving functions.

2. Description of the Prior Art

In some complementary metal-oxide semiconductor (CMOS) RF power amplifier designs, the output power is most efficiently consumed at a 50% pulsewidth. The buffer and delay elements are inserted between the source and destination of signals to adjust the pulsewidth. The buffer and delay elements are composed of some delay elements. The pulsewidth of a clock signal is determined by a phase-locked loop (PLL). The oscillator of a PLL operates at twice the required frequency. Then the operating frequency is divided by two, and yields a 50% pulsewidth. Multiplying up the oscillator frequency results in more power dissipation. Furthermore, this approach is in prejudice of designing oscillators for a wide-range operating frequency.

The digital PWCL at present is proposed to overcome the shortcomings of the conventional PLL. It has high ability of immunity to noise and a short locking time. The PWCLs are applied in system-on-chip (SOC) designs, delay locked loops (DLL) and phase-locked loops (PLL) to adjust the pulsewidth of a clock signal. As the demand on operation frequency of SOC increases, the variation of the pulsewidth is indeed a bottleneck in designing, and for low-voltage design aspects, reducing the supply voltage of a circuit is also inevitable.

Referring to FIG. 1, it schematically shows a PWCL circuit of system-on-chip device 100. The PWCL circuit includes a control stage circuit 110, a buffer chain 120, an oscillator 130, two charge pumps 140 and 150, one comparator 160, and three bypass capacitances C1~C3. The control stage circuit 110 is used to receive a clock signal $Ck_{in}$ and a control signal $V_{ctr}$ from the feedback of the comparator 160. Then it outputs a signal to the buffer chain 120, and generates an output signal $Ck_{out}$ from the buffer chain 120 to the charge pump 140. And then it outputs another signal from the oscillator 130 to the charge pump 150. Then, the charge pumps 140 and 150 output $V_c$ and $V_{ref}$ to the two inputs of the comparator 160 individually. It will generate a control signal $V_{ctr}$ and feedback the control signal $V_{ctr}$ to the control stage circuit 110. Besides, one end of the bypass capacitance C1 is coupled with the output of the charge pump 140 and the positive input of comparator 160, and the other end is grounded. One end of the bypass capacitance C2 is coupled with the output of the charge pump 150 and the negative input of the comparator 160, and the other end is grounded. One end of the bypass capacitance C3 is coupled with the output of the comparator 160, and the other end is grounded. When the pulsewidth of $Ck_{out}$ is under 50%, there is longer time for the charge pump 140 to charge C1 and $V_c$ increases. Therefore, control signal $V_{ctr}$ of the comparator 160 rises, increasing the pulsewidth of $Ck_{out}$. Finally, $V_c$ equals $V_{ref}$ when the PWCL device 100 is stabilized. $Ck_{out}$ reaches a 50% pulsewidth. When the pulsewidth of $Ck_{out}$ exceeds 50%, the charge pump 140 discharges more current and makes $V_c$ fall. Control signal $V_{ctr}$ of the comparator 160 falls, reducing the pulsewidth of $Ck_{out}$. Then, $V_c$ equals to $V_{ref}$ when PWCL device 100 is stabilized. Finally, $Ck_{out}$ reaches a 50% pulsewidth.

The oscillating frequency of the oscillator 130 is constant, and is unrelated to the clock signal $Ck_{in}$. Input signals from the charge pumps 140 and 150 are two individual signal sources (because the frequency and the phase of two signal sources are unrelated). Therefore, the voltage error ($V_c - V_{ref}$) of the control loop device increases, leading to a possibly unstable operation. On the other hand, the process variation of the buffer chains 120 and oscillator 130 reduces the accuracy of the pulsewidth.

SUMMARY OF THE INVENTION

It is therefore an objective of the present invention to provide a mutual-correlated pulsewidth control loop (MC-PWCL) circuit to overcome the shortcomings of the conventional control loop device. One main purpose is to adjust the pulsewidth and increase the stability of the MC-PWCL. Another purpose of the present invention is to reduce the effect of process variation.

Besides, the present invention further provides a free-skew mutual-correlated pulsewidth control loop (FSMC-PWCL) device. The main purpose is to reduce signal jitter and save power dissipation.

In accordance with the forgoing objective, the present invention provides a MC-PWCL device, comprising one control stage circuit, one buffer chain, one complementary circuit, two charge pumps, and one comparator. The control stage circuit is used to receive a clock signal and the control signal of the comparator, and output a signal to the buffer chain. The buffer chain is used to receive the output signals from the control stage circuit and generate an output signal of the buffer chain. The output signal of the buffer chain is used to input to the complementary circuit and generate two output signals to the two charge pumps. Each of the two charge pumps is used to receive one of the output signals from the complementary circuit and generate an output signal to be one of the inputs of the comparator. The comparator is used to receive the output signals from each of the two charge pumps, generate a control signal and feedback to the control stage circuit.

Meanwhile, the present invention also provides a phase blending circuit inserted between complementary circuit and charge pump in the MC-PWCL, which uses phase blending to eliminate the timing skew of the delay elements and tolerate larger process variations than MC-PWCL to form a FSMC-PWCL.

DESCRIPTION OF THE PREFERRED EMBODIMENT

Figure 1:
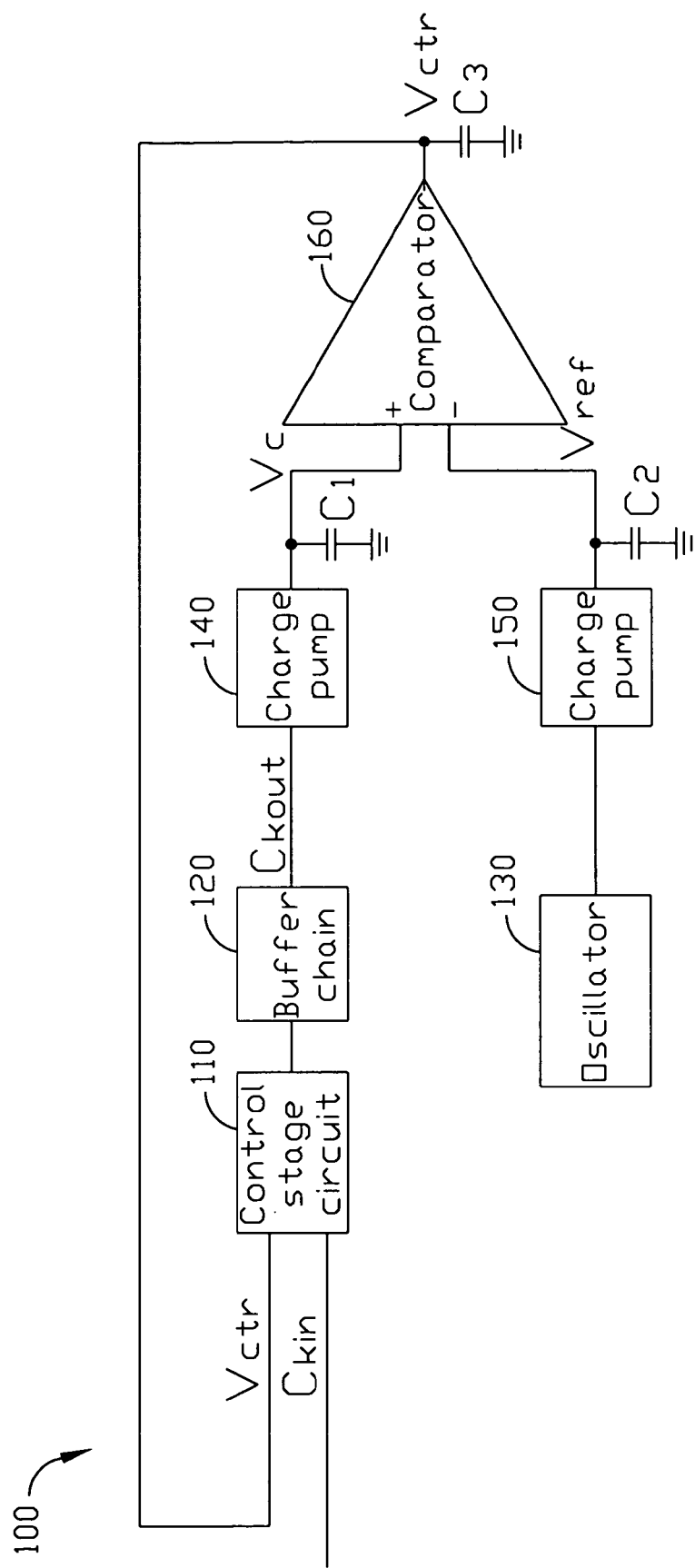
FIG. 1 schematically shows the circuit structure of a conventional PWCL device.

Reference will be made in detail to the present preferred embodiment of the invention, examples of which are illustrated in the accompanying drawings. Nevertheless, it should be recognized that the present invention can be practiced in a wide range of other embodiments besides those explicitly described, and the scope of the present invention is expressly not limited except as specified in the accompanying claims.

The present invention provides the MC-PWCL circuit device 200, comprising the control stage circuit 210, the buffer chain 220, the complementary circuit 230, the charge pumps 240 and 250, the comparator 260, and the bypass capacitances C1~C3.

Figure 2:
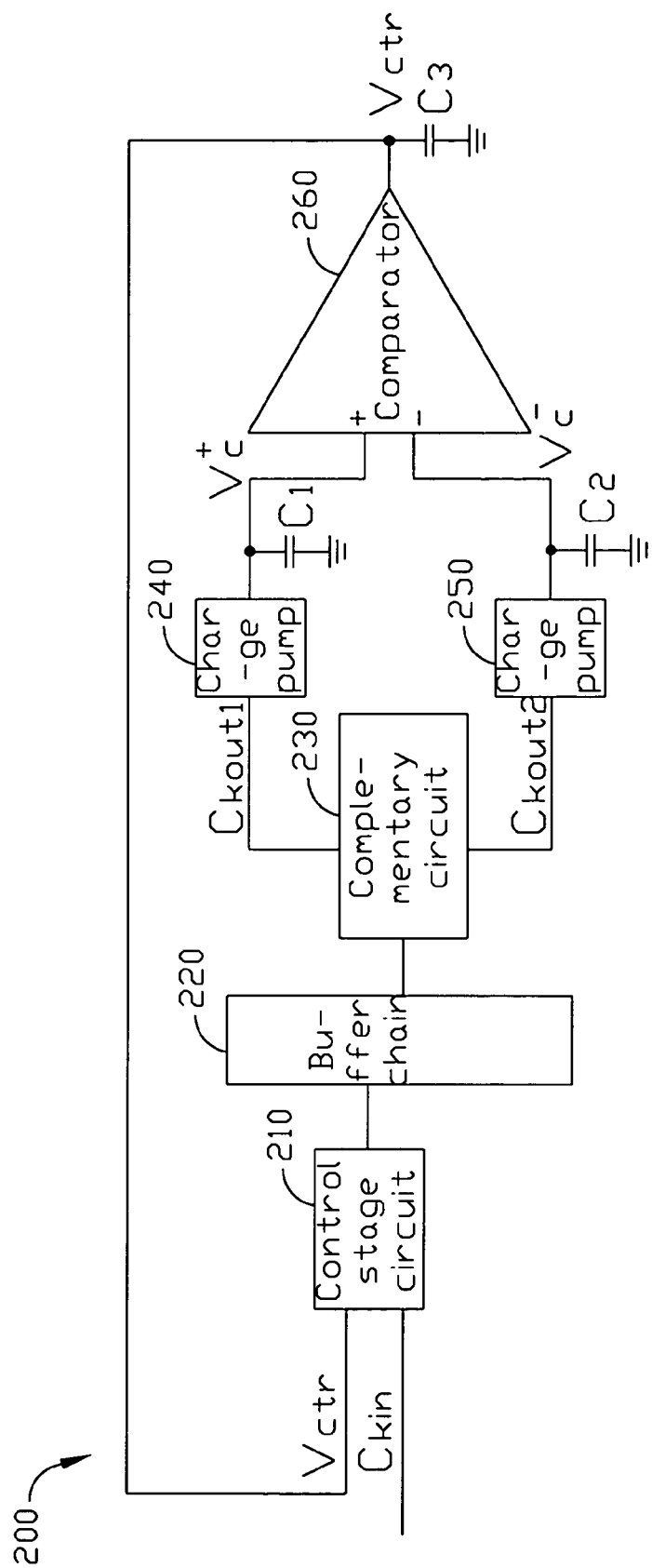
FIG. 2 schematically shows the circuit structure of an improved MC-PWCL device according to the present invention.

First, as shown in FIG. 2, it is the circuit structure of the improved MC-PWCL device according to the present invention. The control stage circuit 210 is used to receive a clock signal $Ck_{in}$ and the control signal $V_{ctr}$ from the comparator 260, and output a signal to the buffer chain 220. The buffer chain 220 is used to receive the output signal from the control stage circuit 210 and generate an output signal to the complementary circuit 230. The complementary circuit 230 is used to generate two complementary output signals $Ck_{out1}$ and $Ck_{out2}$, and send them to each of the charge pumps 240 and 250 individually. Each of the charge pumps 240 and 250 is used to generate output signals $V_c^+$ and $V_c^-$ respectively to the two inputs of the comparator 260, output a control signal $V_{ctr}$ and feedback to the control stage circuit 210.

Figure 3:
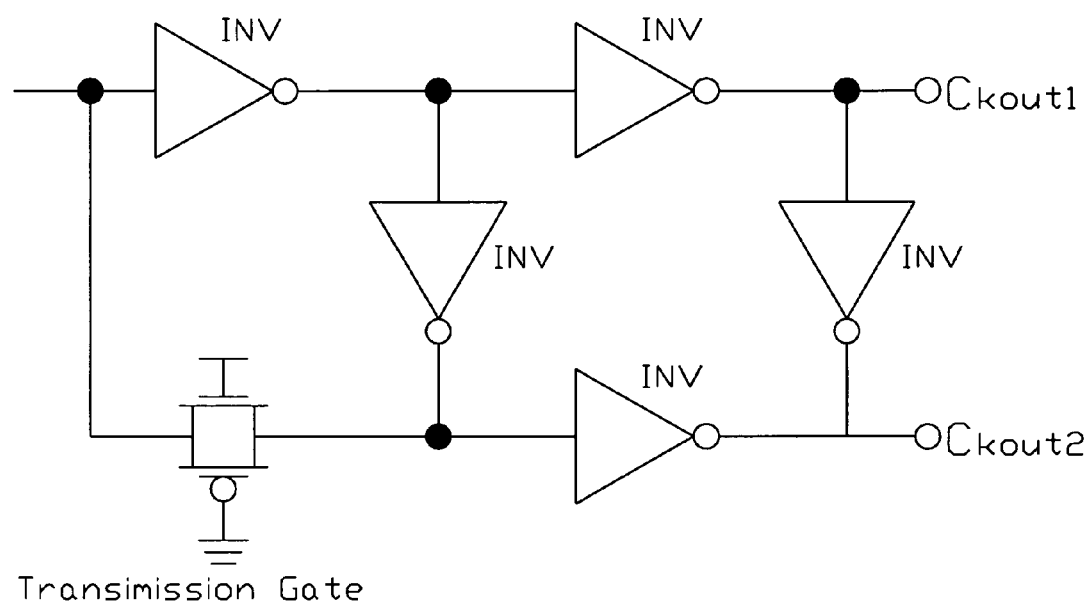
FIG. 3 schematically shows the circuit structure of a complementary circuit.

In the MC-PWCL device 200 mentioned above, the complementary circuit 230 is used to generate two complementary output signals $Ck_{out1}$ and $Ck_{out2}$ (i.e. phase shifted by 180°, as shown in FIG. 3). By using some inverters and delay devices (such as a transmission gate) of the complementary circuit 230, it generates a phase correlation between output signals $Ck_{out1}$ and $Ck_{out2}$. Finally the signals $Ck_{out1}$ and $Ck_{out2}$ are phase shifted by 180°. The output signals $Ck_{out1}$ and $Ck_{out2}$ are inputted to each of the charge pumps 240 and 250 individually, generating two complementary output bias voltage $V_c^+$ and $V_c^-$. When the pulsewidth of complementary signals $Ck_{out1}$ is under 50%, the pulsewidth of $Ck_{out2}$ exceeds 50%. There is longer time for the charge pump 240 to charge C1 and make $V_c^+$ rise; and there is also longer time for the charge pump 250 to discharge C2 and make $V_c^-$ fall. Therefore the input difference voltage of the comparator 260 is twice the comparator 160 in FIG. 1, resulting in a faster change of control signal $V_{ctr}$. Finally, the pulsewidth of $Ck_{out1}$ and Ckout2 reaches 50% in the stable state. The stability problem in FIG. 1 can be solved because the inputs of two charge pumps are at the same frequency.

To analyze the characteristics of the PWCL, the voltage error is defined as the voltage difference of two inputs of the comparator, where $(V_c - V_{ref})$ and $(V_c^+ - V_c^-)$ are as defined in FIG. 1 and FIG. 2, respectively. The inputs $V_c$ and $V_{ref}$ to the charge pumps 140 and 150 of the conventional PWCL in FIG. 1 are unrelated to frequency and phase of these signals, increasing the voltage error. The voltage error can be improved by sending two complementary signals to the inputs of the charge pumps 240 and 250, for instance by using the complementary circuit 230 so that it outputs two complementary signals to charge pumps 240 and 250, which is shown in FIG. 2. Besides, the PWCL 200 in FIG. 2 can be connected to the output of a PLL to determine pulsewidth of an output signal. The PWCL 200 operates the frequency operating range of the PLL. Since the input signals $Ck_{out1}$ and $Ck_{out2}$ of the charge pumps 240 and 250 in FIG. 2 are complementary signals, thus they have the same operation frequency. As the frequency of $Ck_{in}$ falls, the input signals $Ck_{out1}$ and $Ck_{out2}$ of the charge pumps 240 and 250 remain at same operating frequency as $Ck_{in}$. Consequently, the power dissipation can be reduced.

The process variation of the devices in the PWCL 100 can lead to a variation of the pulsewidth. Hence, the modified PWCL 200 is less sensitive to process variation by the complementary circuit scheme. The variation of $V_{ctr}$ due to the voltage error of the comparator inputs impacts the jitter of the output signal. The variation can be reduced using a larger capacitor that results in a large area. The modified PWCL 200 has been proven to be associated with less process variation. The jitter can be reduced using smaller capacitors. At an operation frequency of 300 MHz, the power dissipation and voltage ripple reduces by 35.4% and 93.7%, respectively. At 1 GHz, the power dissipation and voltage ripple reduces by 6.4% and 82.1%, respectively.

Although the stability of the conventional PWCL is improved and the voltage ripple of the comparator output is reduced in the MC-PWCL scheme 200 of the present invention, yet the process variation of the delay element in MC-PWCL reduces the accuracy of the pulsewidth.

Figure 4:
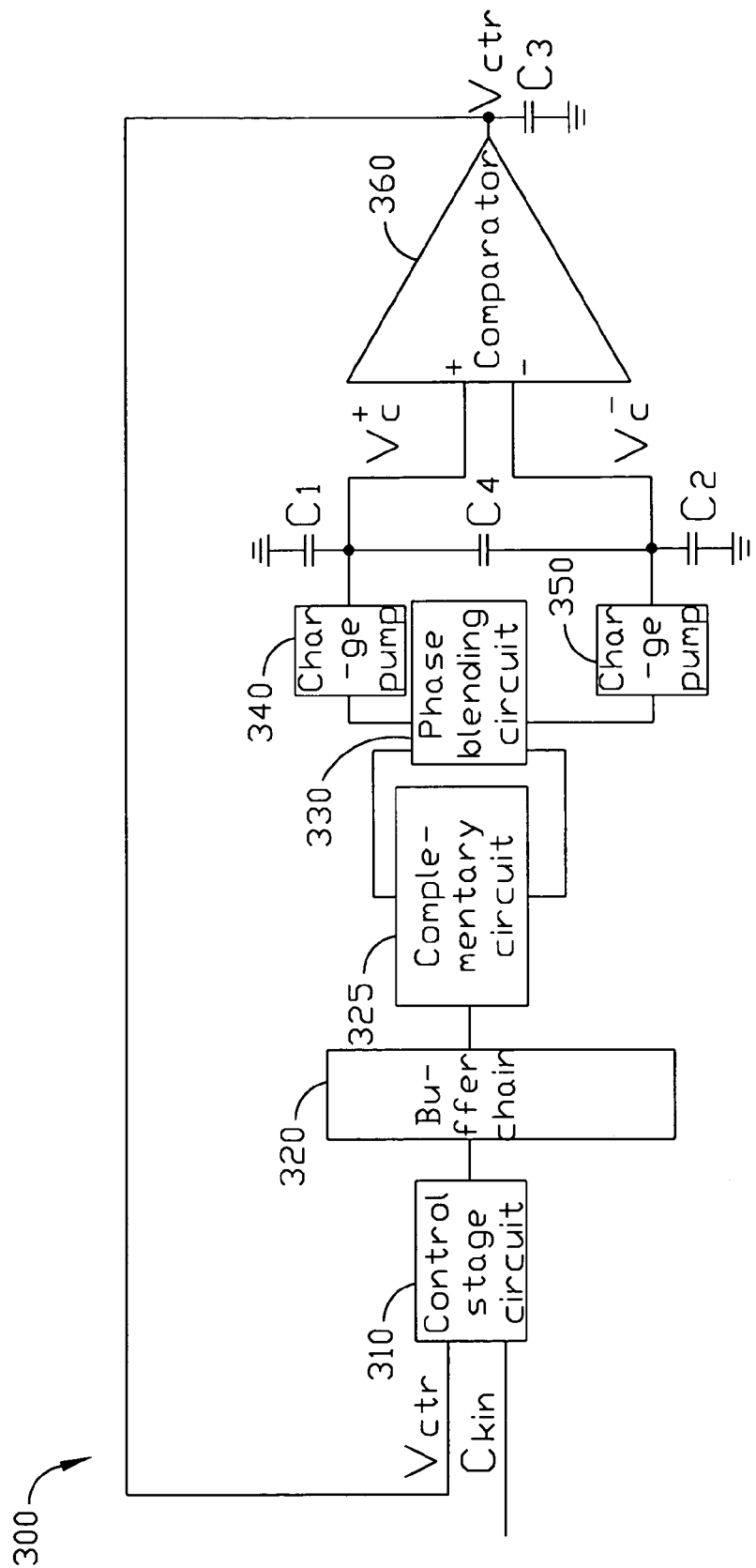
FIG. 4 schematically shows the circuit structure of an improved FSMC-PWCL device according to the present invention.

In the following, as shown in FIG. 4, is the circuit structure of an improved FSMC-PWCL device according to the present invention. The control loop device 300 in FIG. 4 includes the control stage circuit 310, the buffer chain 320, the complementary circuit 325, the phase blending circuit 330, the charge pumps 340 and 350, the comparator 360, the bypass capacitances C1~C3, and the decoupling capacitance C4. The control stage circuit 310 is used to receive a clock signal $Ck_{in}$ and a control signal $V_{ctr}$ of the comparator 360, and output a signal to the buffer chain 320. The buffer chain 320 is used to receive the output signal from the control stage circuit 310, and output a signal to the complementary circuit 325. The complementary circuit 325 is used to send the complementary signals to phase blending circuit 330. The phase blending circuit 330 is used to receive the complementary signals from the complementary circuit, and generate two output signals to the charge pumps 340 and 350. Each of the charge pumps 340 and 350 is used to generate the output signals $V_c^+$ and $V_c^-$ respectively to the two inputs of the comparator 360. The comparator 360 is used to receive the output signals from each of the charge pumps 340 and 350 respectively, generate a control signal $V_{ctr}$ and feedback to the control stage circuit 310. Besides, one end of the bypass capacitance C1 is coupled with the output of the charge pump 340 and the positive input of comparator 360, and the other end is grounded. One end of the bypass capacitance C2 is coupled with the output of the charge pump 350 and the negative input of the comparator 360, and the other end is grounded. One end of the bypass capacitance C3 is coupled with the output of the comparator 360, and the other end is grounded. The decoupling capacitance C4 is coupled with the inputs $V_c^+$ and $V_c^-$ of the comparator 360 and makes $V_c^+$ and $V_c^-$ slightly short in a high frequency to reduce the small changes in $V_c^+$ and $V_c^-$. Therefore, the voltage ripple of the comparator output in FSMC-PWCL could be reduced owing to the smaller voltage error in $V_c^+$ and $V_c^-$ than MC-PWCL, so that the device could adjust the pulsewidth and increase the stability of the FSMC-PWCL.

It is evident that the phase blending circuit 330 is inserted between the complementary circuit and the charge pumps in the MC-PWCL device 200 in FIG. 2. The FSMC-PWCL device 300 utilizes phase blending to eliminate the timing skew of the delay elements and therefore can tolerate larger process variations than the MC-PWCL device 200.

Figure 5:
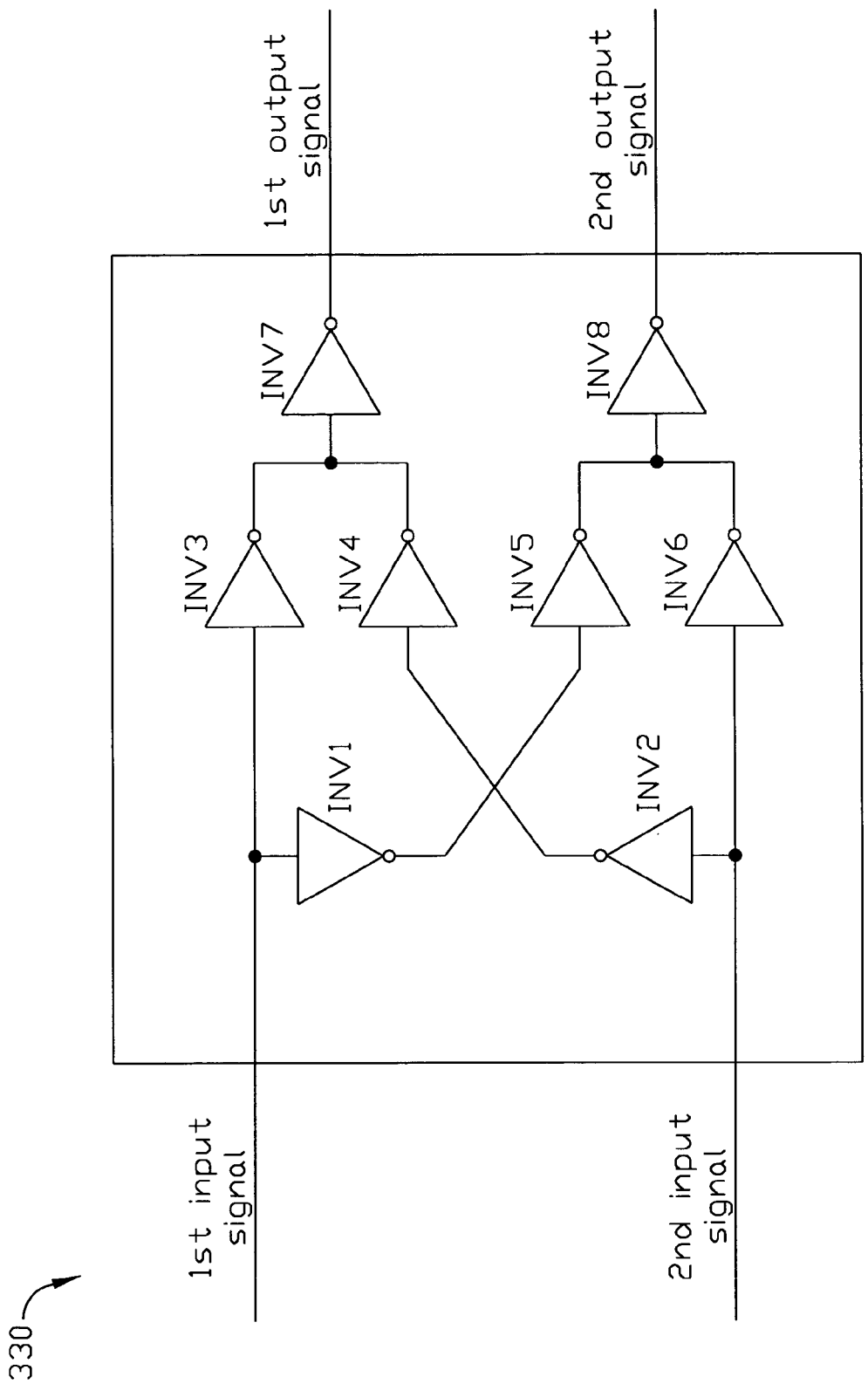
FIG. 5 schematically shows the circuit structure of a phase blending circuit.

In the following, as is shown in FIG. 5, is the phase blending circuit device according to the present invention. The phase blending circuit device 330 of the present invention is composed of the inverters (INV1~INV8). The $1^{st}$ input signal (eg, a $Ck_{out1}$) is coupled with the inputs of INV1 and INV3, and the $2^{nd}$ input signal (eg, a $Ck_{out2}$) is coupled with the inputs of INV2 and INV6. Each of the outputs of INV1 and INV2 is coupled with the inputs of INV5 and INV4 respectively. Then the outputs of INV3 and INV4 are jointly coupled with the inputs of INV7, and the outputs of INV5 and INV6 are jointly coupled with the inputs of INV8. INV7 blends with the $1^{st}$ input invert signal (inverted by INV3) and the $2^{nd}$ input signal (inverted by INV2 and INV4), and INV8 blends with the $2^{nd}$ input invert signal (inverted by INV6) and the $1^{st}$ input signal (inverted by INV1 and INV5). Finally, it outputs the $1^{st}$ output signal from the outputs of INV7, and it outputs the $2^{nd}$ output signal from the outputs of INV8, which is complementary of the $1^{st}$ output signal. Therefore, after passing the phase blending circuit 330 in FIG. 5, it makes the complementary signals generated by the complementary circuit 325 generate phase blending effects.

Figure 6:
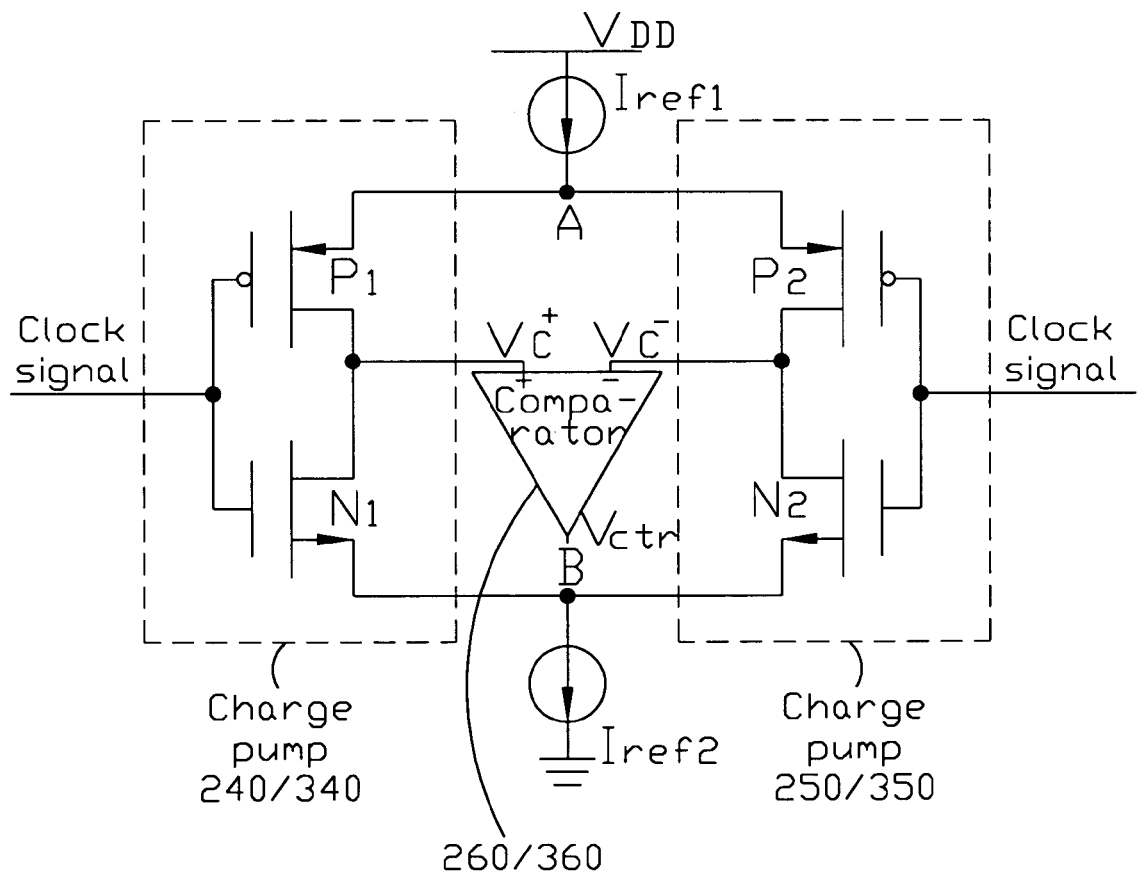
FIG. 6 schematically shows the circuit structure of the current source charge pump of the shared current source.

Two charge pumps have individual current source in the conventional PWCL. The voltage ripples of the inputs and the outputs are largely resulting from the switching of the current sources. As shown in FIG. 6, it is the charge pump according to the present invention that increases accuracy of the output current. It should be emphasized that the charge pump is only suitable for the complementary signals and 50% pulsewidth of the present invention. Referring to FIG. 6, the charge pump includes two current sources $I_{ref1}$ and $I_{ref2}$, the p-type MOS (PMOS) P1 and P2, and the n-type MOS (NMOS) N1 and N2. One end of the current source $I_{ref1}$ is coupled with the system voltage $V_{DD}$, and the other end is coupled with source of the transistors P1 and P2. One end of the current source $I_{ref2}$ is coupled with the system voltage GND, and the other end is coupled with source of the transistors N1 and N2. A $1^{st}$ input signal is coupled with gate of the transistors P1 and N1, and the $1^{st}$ input signal could be the output signal of the phase blending circuit 330. A $2^{nd}$ input signal is coupled with gate of the transistors P2 and N2, and the $2^{nd}$ input signal could be another output signal of the phase blending circuit 330. The drain of the transistor P1 and N1 are coupled with the positive input $V_c^+$ of the comparator 360, and the drain of the transistor P2 and N2 are coupled with the negative input $V_c^-$. The proposed method uses the complementary switch scheme to ensure that the current source $I_{ref1}$ and $I_{ref2}$ always have one turn-on path, thus stabilizing the voltage of the node A and B; the output current is more stable as well and saves two current sources at the same time.

The preferred embodiments are only for illustrating the present invention, not to limit the scope thereof. Many modifications of the preferred embodiments can be made without departing from the spirit of the present invention.

What is claimed is:

1. A mutual-correlated pulsewidth control loop circuit device, comprising:

a control stage circuit, one end of which being coupled with a control signal and a clock signal and another end of said control stage circuit outputting an output signal;

a buffer chain, one end of which being coupled with another end of said control stage for receiving said output signal of said control stage circuit and another end of said buffer chain outputting another output signal;

a complementary circuit, one end of which being coupled with said another end of said buffer chain for receiving said another output signal of said buffer chain and another end of said complementary circuit outputting a pair of complementary output signals;

two charge pumps, one end of each being coupled with said pair of complementary output signals of said complementary circuit respectively, and another end of said two charge pumps generating a charge pump output signal respectively; and a comparator, one end of which being respectively coupled with said charge pump output signal of each of said two charge pumps and another end of said comparator outputting said control signal, feedback said control signal to said control stage circuit at the same time.

2. The circuit device according to claim 1, further comprising a phase blending circuit, one end of which being respectively coupled with said pair of complementary output signals of said complementary circuit for generating two complementary phase blending signals, another end of said phase blending circuit outputting to said two charge pumps respectively.

3. The circuit device according to claim 1, wherein said buffer chain is composed by a plurality of inverters.

4. The circuit device according to claim 1, wherein said pair of complementary signals of said complementary circuit are phase shifted by 180°.

5. The circuit device according to claim 1, wherein said two charge pumps use a current source commonly.

6. The circuit device according to claim 2, wherein said output signals of said phase blending circuit are phase complementary signals.

7. The circuit device according to claim 2, wherein said phase blending circuit is composed by a plurality of inverters.

8. A free-skew mutual-correlated pulsewidth control loop circuit, comprising:

a control stage circuit, one end of which being coupled with a control signal and a clock signal and another end of said control stage circuit outputting an output signal;

a buffer chain, one end of which being coupled with another end of said control stage for receiving said output signal of said control stage circuit and another end of said buffer chain generating another output signal;

a complementary circuit, one end of which being coupled with said another end of said buffer chain for receiving said another output signal of said buffer chain and another end of said complementary circuit outputting a pair of complementary output signals;

a phase blending circuit, one end of which being respectively coupled with said pair of complementary output signals of said complementary circuit for generating two complementary phase blending signals to be outputted from another end;

two charge pumps, one end of each being coupled with said output signal of said phase blending circuit respectively and another end of said two charge pumps generating a charge pump output signal respectively;

a decoupling capacitor, two ends of which being coupled with said another end of said two charge pumps; and a comparator, one end of which being respectively coupled with said charge pump output signal of each of said two charge pumps and another end of said comparator outputting said control signal, feedback said control signal to said control stage circuit at the same time.

9. The circuit according to claim 8, wherein said buffer chain is composed by a plurality of inverters.

10. The circuit according to claim 8, wherein said pair of complementary signals of said complementary circuit are phase shifted by 180°.

11. The circuit according to claim 8, wherein said two charge pumps use a current source commonly.

12. The circuit according to claim 8, wherein said output signals of said phase blending circuit are phase complementary signals.

13. The circuit according to claim 8, wherein said buffer chain is composed by a plurality of inverters.

14. A mutual-correlated pulsewidth control loop circuit device with system-on-chip (SOC) inserted, comprising:
  a control stage circuit, one end of which being coupled with a control signal and a clock signal and another end of said control stage circuit outputting a output signal;
  a buffer chain, one end of which being coupled with said another end of said control stage circuit for receiving said output signal of said control stage circuit and another end of said buffer chain outputting another output signal;
  a complementary circuit, one end of which being coupled with said another end of said buffer chain for receiving said output signal of said buffer chain and another end of said complementary circuit outputting a pair of complementary output signals;
  two charge pumps, one end of each being coupled with said pair of complementary output signals of said complementary circuit respectively and another end of said two charge pumps generating a charge pump output signal respectively;
  a comparator, one end of which being respectively coupled with said charge pump output signal of each of said two charge pumps and another end of said comparator outputting said control signal, feedback said control signal to said control stage circuit at the same time; and
  a system-on-chip, receiving said pair of complementary output signals outputted by said complementary circuit.

15. The circuit device according to claim 14, further comprising a phase blending circuit, one end of which being respectively coupled with said pair of complementary output signals of said complementary circuit for generating two complementary phase blending signals, another end of said phase blending circuit outputting to said two charge pumps respectively.

16. The circuit device according to claim 14, wherein said two charge pumps use a current source commonly.

17. The circuit device according to claim 15, wherein output signals of said phase blending circuit are phase complementary signals.

18. The circuit device according to claim 14, further comprises a decoupling capacitor, two ends of which being coupled with another end of said two charge pumps.

* * * * *